US009157962B1

(12) United States Patent
Wang

(10) Patent No.: US 9,157,962 B1
(45) Date of Patent: Oct. 13, 2015

(54) APPARATUS AND METHOD FOR TESTING A SCAN CHAIN INCLUDING MODIFYING A FIRST CLOCK SIGNAL TO SIMULATE HIGH-FREQUENCY OPERATION ASSOCIATED WITH A SECOND CLOCK SIGNAL

(71) Applicant: Marvell International LTD., Hamilton (BM)

(72) Inventor: Yongjiang Wang, Austin, TX (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/149,090

(22) Filed: Jan. 7, 2014

Related U.S. Application Data

(63) Continuation of application No. 13/039,352, filed on Mar. 3, 2011, now Pat. No. 8,627,155.

(60) Provisional application No. 61/312,133, filed on Mar. 9, 2010, provisional application No. 61/312,883, filed on Mar. 11, 2010, provisional application No. 61/318,564, filed on Mar. 29, 2010.

(51) Int. Cl.
G01R 31/319 (2006.01)
G01R 31/3177 (2006.01)
G01R 31/3185 (2006.01)

(52) U.S. Cl.
CPC ...... *G01R 31/31922* (2013.01); *G01R 31/3177* (2013.01); *G01R 31/318525* (2013.01); *G01R 31/318533* (2013.01); *G01R 31/318552* (2013.01)

(58) Field of Classification Search
CPC .................. G01R 31/3177; G01R 31/318525; G01R 31/318533; G01R 31/318552; G01R 31/31922

USPC ......................................................... 714/731
See application file for complete search history.

(56) References Cited

U.S. PATENT DOCUMENTS 6,055,658 A * 4/2000 Jaber et al. .................... 714/726
6,239,627 B1 5/2001 Brown et al.
(Continued)

FOREIGN PATENT DOCUMENTS

EP 1873539 A1 * 1/2008 ......... G01R 31/3185

OTHER PUBLICATIONS

Ahmed, N.; Tehranipoor, M.; Ravikumar, C.P.; Butler, K.M., "Local At-Speed Scan Enable Generation for Transition Fault Testing Using Low-Cost Testers," Computer-Aided Design of Integrated Circuits and Systems, IEEE Transactions on, vol. 26, No. 5, pp. 896,906, May 2007.*

(Continued)

*Primary Examiner* — Cynthia Britt

(57) ABSTRACT

A circuit including a clock module, a control module, a manipulation module, and a function module. The clock module generates a first clock signal. The control module generates a control signal. The manipulation module, based on the control signal, either (i) forwards the first clock signal without modifying the first clock signal or (ii) modifies a cycle of the first clock signal to simulate a second clock signal. The second clock signal has a frequency higher than a frequency of the first clock signal. The function module: during a first mode and based on a non-modified cycle of the first clock signal, operates devices in a predetermined configuration; ceases operating in the first mode and changes the predetermined configuration of the devices to form a scan chain; and during a second mode and based on the modified cycle, operates the scan chain to test the devices.

21 Claims, 8 Drawing Sheets

(56) References Cited

U.S. PATENT DOCUMENTS

| | | | |
|---|---|---|---|
| 6,266,749 B1 | 7/2001 | Hashimoto et al. | |
| 7,358,715 B2* | 4/2008 | Shiota et al. | 324/73.1 |
| 7,558,998 B2* | 7/2009 | Watanabe | 714/731 |
| 7,743,300 B1 | 6/2010 | Rosen | |
| 7,793,179 B2* | 9/2010 | Sul | 714/726 |
| 7,975,197 B2* | 7/2011 | Clark et al. | 714/731 |
| 8,862,954 B1* | 10/2014 | Wang | 714/731 |
| 2005/0149892 A1* | 7/2005 | Yee | 716/4 |
| 2012/0173943 A1* | 7/2012 | Cesari | 714/731 |

OTHER PUBLICATIONS

Xijiang Lin; Press, Ron; Rajski, J.; Reuter, P.; Rinderknecht, T.; Swanson, B.; Tamarapalli, N., "High-frequency, at-speed scan testing," Design & Test of Computers, IEEE , vol. 20, No. 5, pp. 17,25, Sep.-Oct. 2003.*

Ruifeng Guo; Wu-Tung Cheng; Kun-Han Tsai, "Speed-Path Debug Using At-Speed Scan Test Patterns," Test Symposium, 2009 14th IEEE European , vol., No., pp. 11,16, May 25-29, 2009.*

Das, S.; Tokunaga; Pant, S.; Wei-Hsiang Ma; Kalaiselvan, S; et al. "Razor II: In Situ Error Detection and Correction for PVT and SER Tolererance,"Solid-State Circuits, IEEE Journal of, vol. 44, No. 1, pp. 32,48, Jan. 2009.

Bowman, K: Tschanz, J; Wilkerson, C; Shih-Lien Lu et el."Circuit techniques for dynamic variation tolerance, "Design Automation Conference, 2009, DAC '09. 46th ACM/IEEE, vol.,No., pp. 4,7, Jul. 26-31, 2009.

* cited by examiner

APPARATUS AND METHOD FOR TESTING A SCAN CHAIN INCLUDING MODIFYING A FIRST CLOCK SIGNAL TO SIMULATE HIGH-FREQUENCY OPERATION ASSOCIATED WITH A SECOND CLOCK SIGNAL

CROSS-REFERENCE TO RELATED APPLICATIONS

The present disclosure is a continuation of U.S. patent application Ser. No. 13/039,352 (now U.S. Pat. No. 8,627, 155), filed on Mar. 3, 2011. This application claims the benefit of U.S. Provisional Application Nos. 61/312,133 filed on Mar. 9, 2010, 61/312,883, filed Mar. 11, 2010 and 61/318, 564, filed Mar. 29, 2010. The entire disclosures of the applications referenced above are incorporated herein by reference.

FIELD

The present invention relates generally to testing integrated circuits. More particularly, the present invention relates to testing of integrated circuits using clock manipulation.

BACKGROUND

Modern integrated circuits generally comprise a large number of circuit elements. It is desirable to test these circuit elements in order to ensure the proper operation of the integrated circuit. However, the number of test points (that is, locations where signals can be measured) is limited by the number of terminals of the integrated circuit, which are vastly outnumbered by the number of circuit elements to be tested.

Consequently, designers of modern integrated circuits often employ test techniques referred to herein as "scan testing." According to scan testing, a mode signal can be asserted that causes predetermined storage elements within an integrated circuit to connect serially to form a scan chain. Data can be shifted into, and out of, the scan chain. Before a test begins, a test vector can be shifted into the scan chain to provide a known starting point for the test. At the end of the test, data can be shifted out of the scan chain for analysis. During the test, the mode signal is negated, thereby breaking the scan chain, so that the integrated circuit can be tested in its nominal configuration. The clock signal is then toggled slowly to simulate nominal operation.

However, it is desirable to test integrated circuits with the clock at higher speeds, in order to identify problems that only appear during high-speed operation. That is, at low speed, an integrated circuit should pass most, if not all tests. However, as the clock speed is increased, the integrated circuit will pass fewer of the tests. The failed tests indicate so-called "speed paths," where portions of the integrated circuit are unable to pass one or more tests at the clock speed tested. It is desirable to locate these speed paths quickly in order to debug the integrated circuit efficiently.

SUMMARY

In general, in one aspect, an embodiment features an apparatus comprising: a function module to operate according to a clock signal; a clock manipulation module to manipulate an edge of the clock signal responsive to occurrence of a predetermined condition; and a report module to indicate a clock cycle number of the edge of the clock signal responsive to occurrence of an error in the function module.

Embodiments of the apparatus can include one or more of the following features. Some embodiments comprise a clock control module to provide a clock control signal responsive to the predetermined condition; wherein the clock manipulation module manipulates the edge of the clock signal responsive to the clock control signal. Some embodiments comprise an error detect module to detect the error in the function module. Some embodiments comprise a clock module to provide the clock signal. In some embodiments, the clock control module comprises: a cycle register to store an offset integer N; a clock counter to count cycles of the clock signal subsequent to occurrence of the predetermined condition; and a comparator to provide the clock control signal responsive to the clock counter counting N cycles of the clock signal. Some embodiments comprise an auto-step module to increment offset integer N in the cycle register, and to reset the function module, responsive to no occurrence of an error in the function module. In some embodiments, the function module includes a plurality of storage elements, further comprising: a test data module to select one of the storage elements based on the clock cycle number. Some embodiments comprise an integrated circuit comprising the apparatus.

In general, in one aspect, an embodiment features a method for testing an integrated circuit, wherein the integrated circuit includes a clock module to provide a clock signal and a function module to operate according to the clock signal, the method comprising: manipulating an edge of the clock signal responsive to occurrence of a predetermined condition; and indicating a clock cycle number of the edge of the clock signal responsive to occurrence of an error in the function module.

Embodiments of the method can include one or more of the following features. Some embodiments comprise providing a clock control signal responsive to the predetermined condition; wherein the edge of the clock signal is manipulated responsive to the clock control signal. Some embodiments comprise detecting the error in the function module. Some embodiments comprise providing the clock signal. Some embodiments comprise storing an offset integer N; counting cycles of the clock signal subsequent to occurrence of the predetermined condition; and providing the clock control signal responsive to the clock counter counting N cycles of the clock signal. Some embodiments comprise incrementing offset integer N, and resetting the function module, responsive to no occurrence of an error in the function module.

In general, in one aspect, an embodiment features non-transitory computer-readable media embodying instructions executable by a computer to perform a method for testing an integrated circuit, wherein the integrated circuit includes a clock module to provide a clock signal and a function module to operate according to the clock signal, the method comprising: manipulating an edge of the clock signal responsive to occurrence of a predetermined condition; and indicating a clock cycle number of the edge of the clock signal responsive to occurrence of an error in the function module.

Embodiments of the non-transitory computer-readable media can include one or more of the following features. In some embodiments, the method further comprises: providing a clock control signal responsive to the predetermined condition; wherein the edge of the clock signal is manipulated responsive to the clock control signal. In some embodiments, the method further comprises: detecting the error in the function module. In some embodiments, the method further comprises: providing the clock signal. In some embodiments, the method further comprises: storing an offset integer N; counting cycles of the clock signal subsequent to occurrence of the predetermined condition; and providing the clock control signal responsive to the clock counter counting N cycles of the clock signal. In some embodiments, the method further comprises: incrementing offset integer N, and resetting the function module, responsive to no occurrence of an error in the function module.

The details of one or more implementations are set forth in the accompanying drawings and the description below. Other features will be apparent from the description and drawings, and from the claims.

Figure 1:
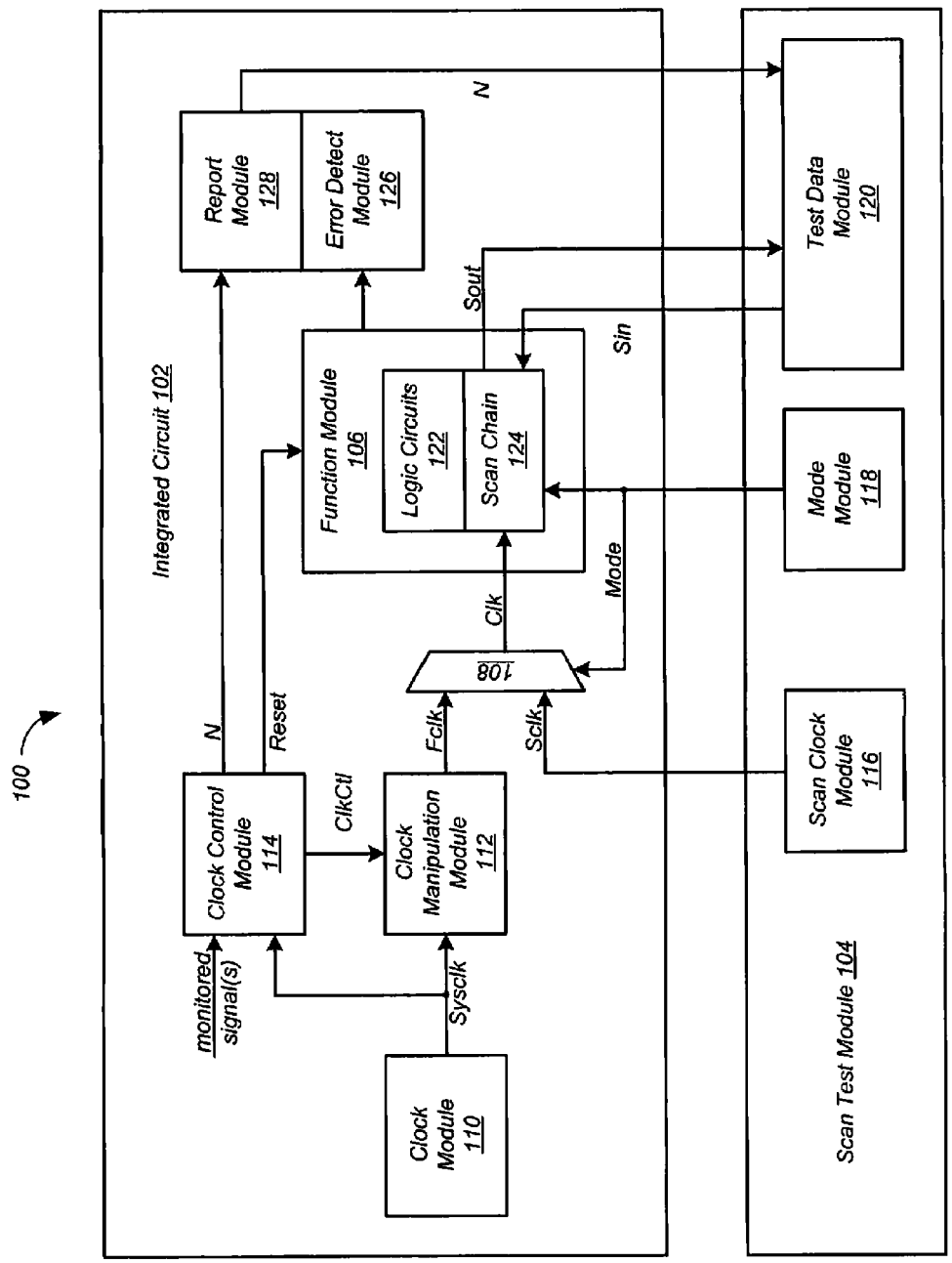
FIG. 1 shows elements of an integrated circuit test system according to one embodiment.

The leading digit(s) of each reference numeral used in this specification indicates the number of the drawing in which the reference numeral first appears.

DETAILED DESCRIPTION

Embodiments of the present disclosure provide integrated circuit scan testing with a clock manipulation feature to provide speed path debug. According to the clock manipulation feature, one or more edges of one or more clock cycles of the internal function clock of the integrated circuit are manipulated to simulate a higher-frequency clock signal during those cycles. By varying the timing of this manipulation, the particular clock cycle where the error occurs can be identified. Based on this timing, the storage elements associated with the error can be identified. Scan testing, or other types of testing, can be used to identify the particular logic circuits responsible for the error.

Some embodiments of the present disclosure also provide an auto-step feature. This auto-step feature allows the clock manipulation feature to manipulate the clock at each clock cycle in a range of clock cycles automatically. When an error is thought to occur within a particular range of clock cycles, the auto-step feature can be used to quickly identify the individual clock cycle associated with the error. According to the auto-step feature, the clock manipulation feature is used to manipulate the function clock N cycles after a predetermined time, or after the occurrence of one or more predetermined conditions, where N is a non-negative integer. If no error occurs, the auto-step feature increments the value of N by 1 or M, and then employs the clock manipulation feature again, where M is a non-negative integer. This process can be repeated as many times as desired to identify the problematic clock cycle.

The clock manipulation and auto-step features can be implemented in integrated circuits in silicon for post-silicon testing. Post-silicon validation is a common and critical step in verifying a design. Post-silicon embodiments permit post-silicon validation using the internal function clock. Test data can therefore be referenced to the function clock, rather than to an external scan clock.

FIG. 1 shows elements of an integrated circuit test system 100 according to one embodiment. Although in the described embodiments the elements of test system 100 are presented in one arrangement, other embodiments may feature other arrangements. For example, elements of test system 100 can be implemented in hardware, software, or combinations thereof. In addition, while the described embodiments employ scan testing, this is not required.

Referring to FIG. 1, test system 100 includes an integrated circuit 102 and a scan test module 104 for performing scan tests on integrated circuit 102. Integrated circuit 102 can be implemented in silicon, as a field-programmable gate array (FPGA), or the like. Integrated circuit 102 includes a function module 106 to be scan tested. Function module 106 operates according to a clock signal Clk, and includes logic circuits 122 and a plurality of storage elements that form a scan chain 124 in response to a Mode signal.

Integrated circuit 102 also includes a multiplexer 108 that provides either a function clock signal Fclk or a scan clock signal Sclk as clock signal Clk in accordance with the Mode signal. Integrated circuit 102 also includes a clock module 110 that provides a system clock signal Sysclk and a clock manipulation module 112 that manipulates system clock signal Sysclk based on a clock control signal ClkCtl, which is provided by a clock control module 114 in accordance with one or more monitored signals. Scan test module 104 includes a scan clock module 116 to provide scan clock Sclk, a mode module 118 to provide the Mode signal, and a test data module 120 to capture data Sout from scan chain 124. In some embodiments, test data module 120 also provides test vectors Sin to scan chain 124 to provide starting points for scan tests.

Integrated circuit 102 also includes an error detect module 126 to detect errors occurring in function module 106, and a report module 128 to report the errors to test data module 120. In particular, report module 128 indicates the clock cycle number associated with the error by reporting a value N provided by clock control module 114, as described in detail below.

Figure 2:
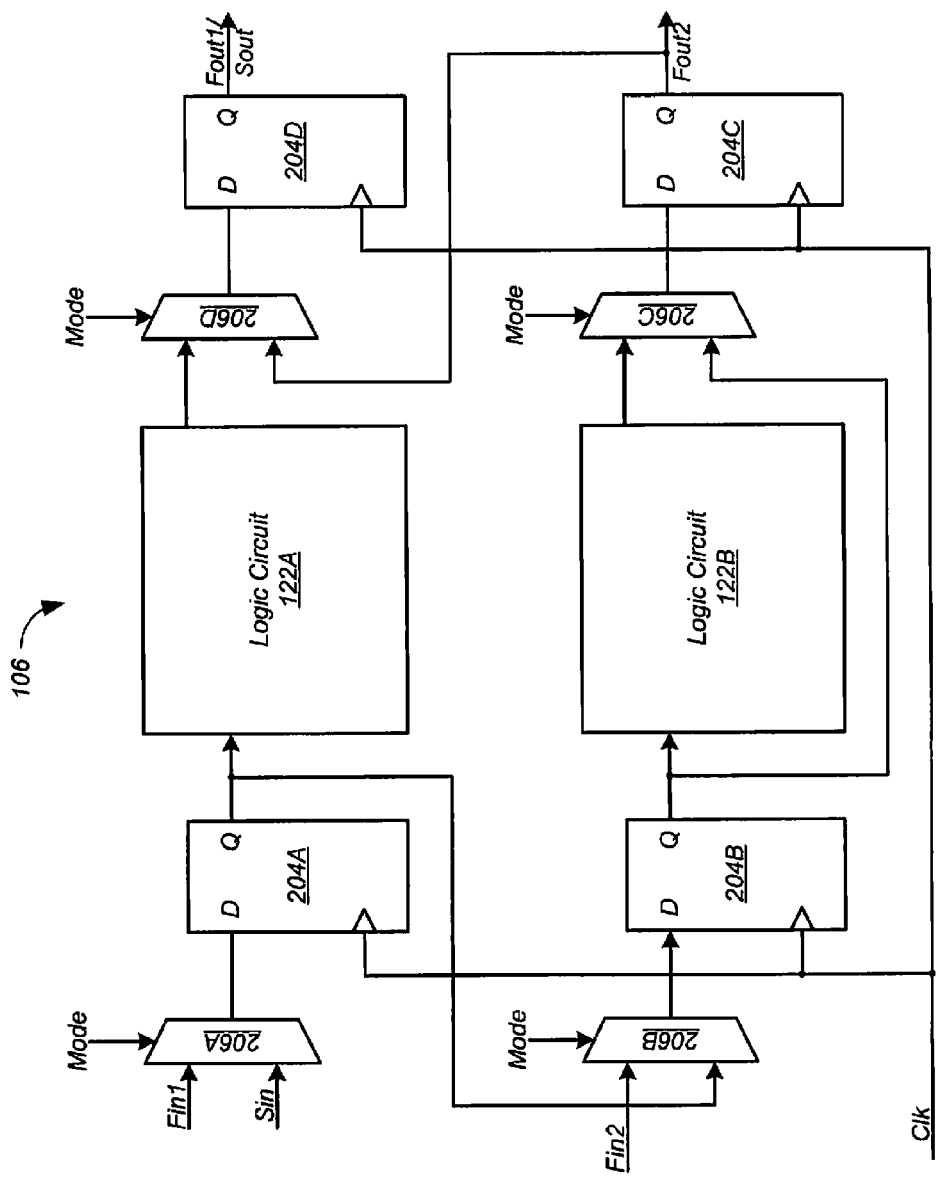
FIG. 2 shows elements of the function module of FIG. 1 according to one embodiment.

FIG. 2 shows elements of function module 106 of FIG. 1 according to one embodiment. Although in the described embodiments the elements of function module 106 are presented in one arrangement, other embodiments may feature other arrangements. For example, elements of function module 106 can be implemented in hardware, software, or combinations thereof.

Referring to FIG. 2, function module 106 includes two logic circuits 122A and 122B, four flip-flops 204A-204D, and four multiplexers 206A-206D. As shown in FIG. 2, multiplexers 206 are controlled by the Mode signal. During scan testing, the Mode signal is first negated, allowing integrated circuit 102 to operate nominally. In nominal operation, multiplexer 108 (FIG. 1) provides function clock signal Fclk as clock signal Clk. Multiplexer 206A passes a function input Fin1 to flip-flop 204A, which passes the function input to logic circuit 122A under the control of function clock Fclk. Similarly, multiplexer 206B passes a function input Fin2 to flip-flop 204B, which passes the function input to logic circuit 122B under the control of function clock Fclk. Multiplexer 206D passes a function output Fout1 to flip-flop 204D, which passes the function output under the control of function clock Fclk. Similarly, multiplexer 206C passes a function output Fout2 to flip-flop 204C, which passes the function output under the control of function clock Fclk.

As part of scan testing, flip-flops 204 of function module 106 interconnect in series to form scan chain 124 in response to the Mode signal. In particular, multiplexer 206A passes scan input Sin to flip-flop 204A, multiplexer 206B connects the output of flip-flop 204A to the input of flip-flop 204B, multiplexer 206C connects the output of flip-flop 204B to the input of flip-flop 204C, and multiplexer 206D connects the output of flip-flop 204C to the input of flip-flop 204D, which provides scan output Sout. In addition, multiplexer 108 provides scan clock Sclk as clock Clk. Scan clock module toggles scan clock Sclk to shift data through scan chain 124.

Figure 3:
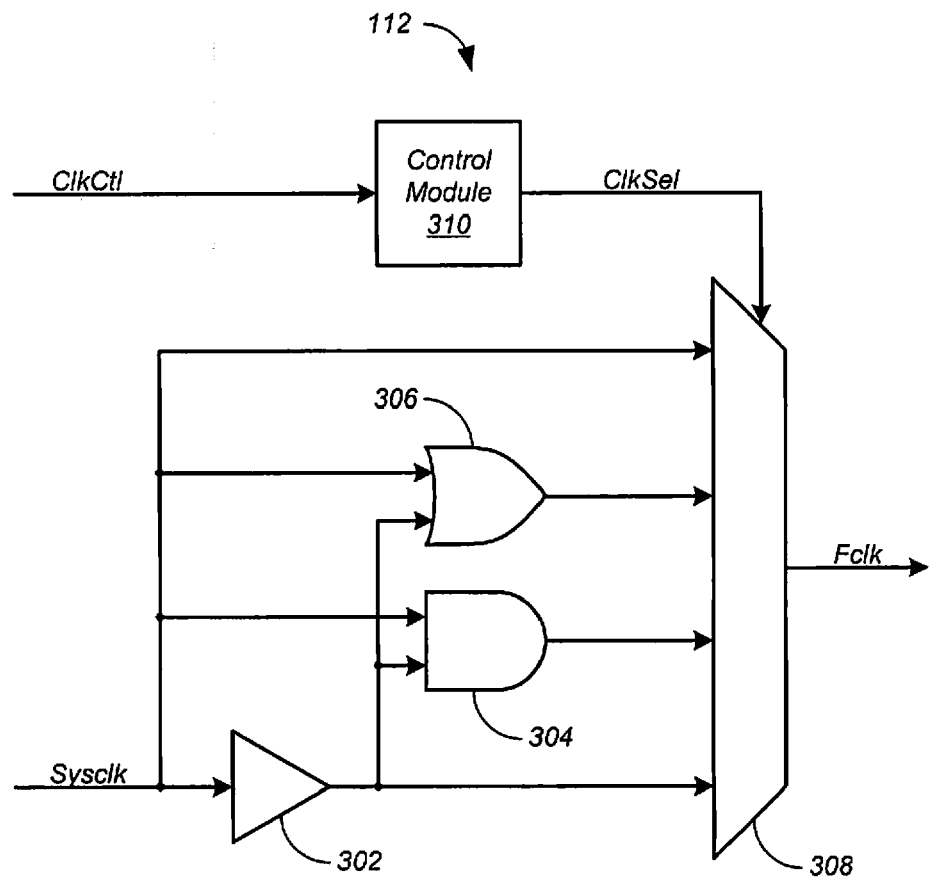
FIG. 3 shows elements of the clock manipulation module of FIG. 1 according to one embodiment.

FIG. 3 shows elements of clock manipulation module 112 of FIG. 1 according to one embodiment. Although in the described embodiments the elements of clock manipulation module 112 are presented in one arrangement, other embodiments may feature other arrangements. For example, elements of clock manipulation module 112 can be implemented in hardware, software, or combinations thereof.

Referring to FIG. 3, clock manipulation module 112 includes a programmable delay element 302, an AND gate 304, an OR gate 306, a multiplexer 308, and a control module 310. AND gate 304, OR gate 306, and multiplexer 308 receive system clock signal Sysclk, as well as a delayed version of system clock Sysclk provided by programmable delay element 302. Multiplexer 308 also receives the outputs of AND gate 304 and OR gate 306. Multiplexer 308 is controlled by a signal ClkSel provided by control module 310 responsive to clock control signal ClkCtl. Multiplexer 308 provides system clock Sysclk as function clock Fclk until clock control signal ClkCtl is asserted. Then multiplexer 308 provides another input as function clock Fclk for one or more clock cycles.

Figure 4:
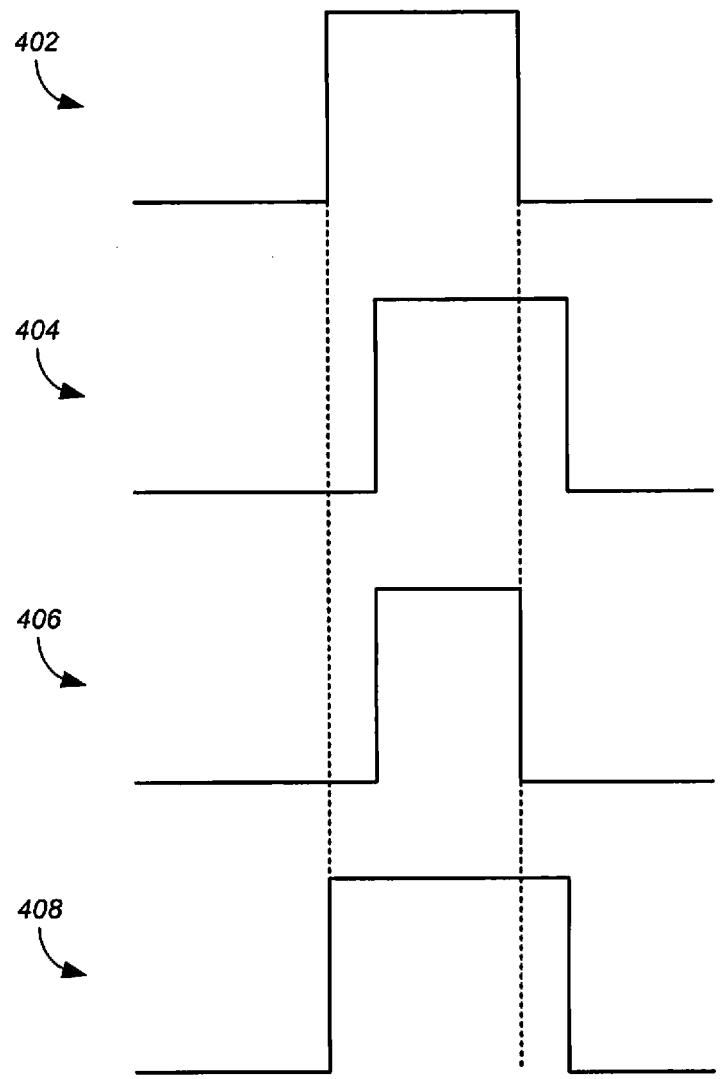
FIG. 4 is a timing diagram illustrating operations of the clock manipulation module of FIG. 4 according to one embodiment.

FIG. 4 is a timing diagram illustrating operations of clock manipulation module 112 of FIG. 4 according to one embodiment. Referring to FIG. 4, system clock signal Sysclk is shown at 402. The output of programmable delay element 302 is shown at 404, where it can be seen that both the rising and falling edges of system clock signal Sysclk have been manipulated. The output of AND gate 304 is shown at 406, where it can be seen that only the rising edge of system clock signal Sysclk has been manipulated. The output of OR gate 306 is shown at 408, where it can be seen that only the falling edge of system clock signal Sysclk has been manipulated. Multiplexer 308 can provide any of signals 402, 404, 406 and 408 as function clock Fclk for one or more clock cycles, in accordance with clock select signal ClkSel.

Figure 5:
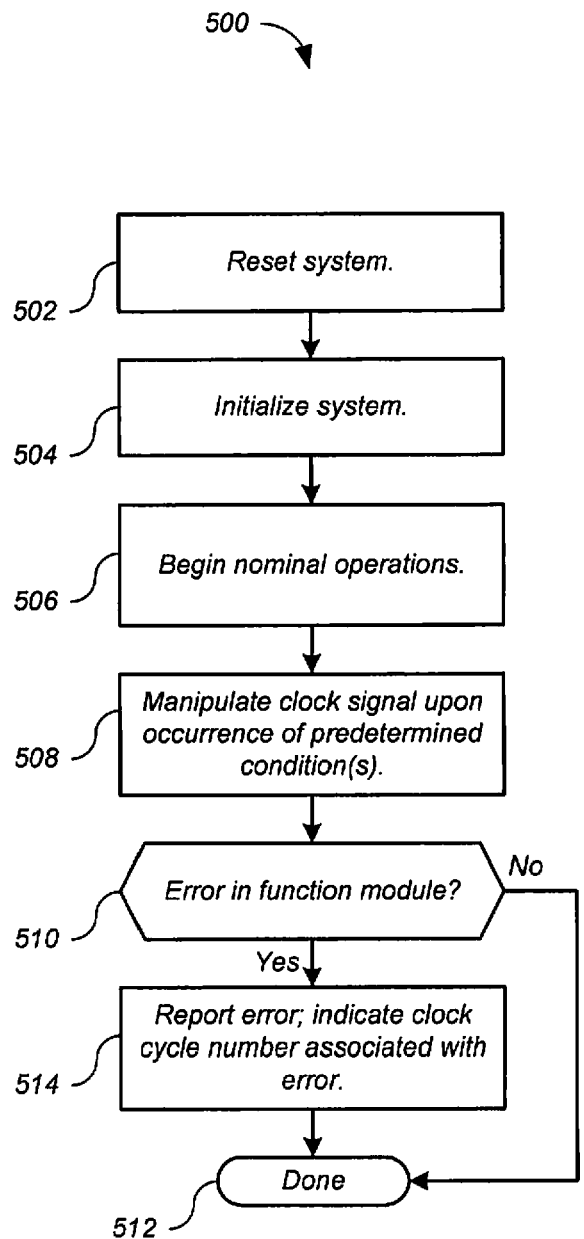
FIG. 5 shows a process for the integrated circuit test system of FIG. 1 according to one embodiment.

FIG. 5 shows a process 500 for integrated circuit test system 100 of FIG. 1 according to one embodiment. Although in the described embodiments the elements of process 500 are presented in one arrangement, other embodiments may feature other arrangements. For example, in various embodiments, some or all of the steps of process 500 can be executed in a different order, concurrently, and the like.

Referring to FIG. 5, at 502 integrated circuit test system 100 is reset. At 504, integrated circuit test system 100 is initialized. In particular, clock control module 114 is programmed to assert clock control signal ClkCtl upon the occurrence of one or more predetermined conditions, for example, when one or more monitored signals assume predetermined values.

At 506, function module 106 begins nominal operations at a predetermined clock speed. In particular, clock module 110 generates system clock signal Sysclk, and clock manipulation module 112 passes system clock signal Sysclk as function clock signal Fclk. During nominal operation, clock control module 114 monitors one or more signals, which are referred to herein as "monitored signals." The monitored signals can include signals generated internally by integrated circuit 102 such as interrupts and special test register outputs, signals provided by devices external to integrated circuit 102, or both.

At 508, upon the occurrence of one or more predetermined conditions, clock manipulation module 112 manipulates function clock signal Fclk. In particular, when the one or more monitored signals assume predetermined values, clock control module 114 asserts clock gate signal ClkCtl. In response, clock manipulation module 112 manipulates one or more edges of system clock signal Sysclk, and provides the resulting signal as function clock signal Fclk.

Error detect module 126 monitors function module 106 for errors. At 510, if no error is detected, process 500 is done at 512. But at 510 if an error is detected, then at 514 report module 128 reports the error to test data module 120, and indicates the clock cycle number N associated with the error. Then process 500 is done at 512.

Clock cycle number N can then be used to debug function module 106. For example, the storage element associated with the error can be identified based on the value of N. In addition, data can be extracted from function module 106 to identify the logic circuits associated with the error. Scan chain 124 can be used to extract the data for analysis. Scan test module 104 forms scan chain 124. Scan test module 104 shifts the data out of scan chain 124. In particular, scan clock module 116 toggles scan clock signal Sclk, which shifts test data Sout from scan chain 124 into test data module 120. At this point the test data is ready for analysis in test data module 120.

Figure 6:
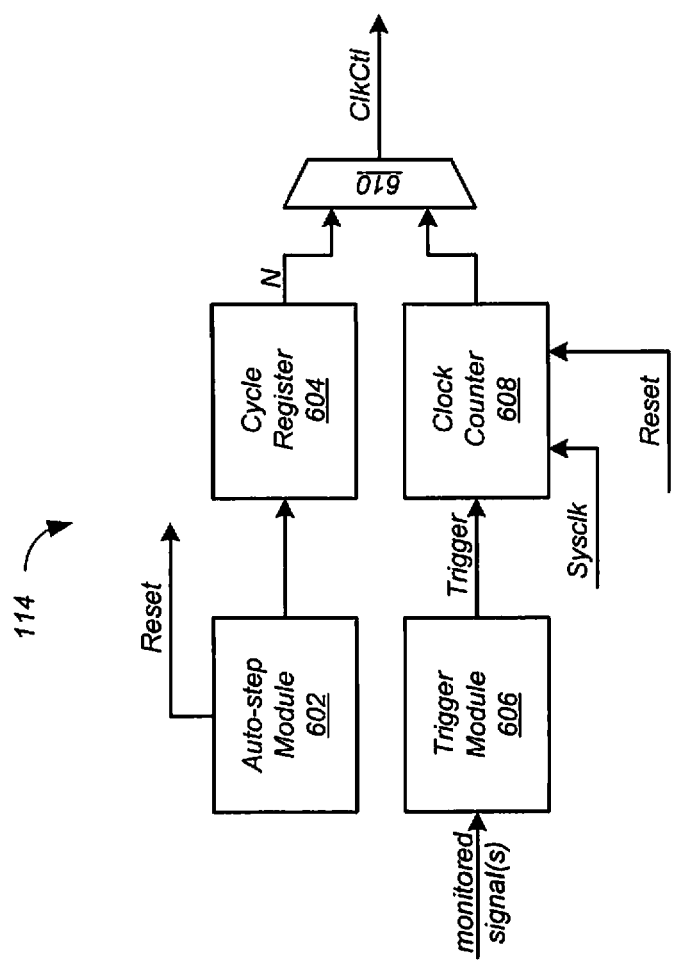
FIG. 6 shows elements of the clock control module of FIG. 1 according to one such embodiment.

As described above, system clock Sysclk can be manipulated automatically upon the occurrence of one or more predetermined conditions. Some embodiments provide a delay feature, where system clock Sysclk can be manipulated automatically after the occurrence of one or more predetermined conditions by a predetermined number of cycles N. FIG. 6 shows elements of clock control module 114 of FIG. 1 according to one such embodiment. Although in the described embodiments the elements of clock control module 114 are presented in one arrangement, other embodiments may feature other arrangements. For example, elements of clock control module 114 can be implemented in hardware, software, or combinations thereof.

Referring to FIG. 6, clock control module 114 includes an auto-step module 602, a cycle register 604, a trigger module 606, a clock counter 608, and a comparator 610. According to the delay feature, cycle register 604 is loaded with a non-negative offset integer N, and trigger module 606 monitors one or more monitored signals. When the monitored signals assume predetermined values, trigger module 606 asserts a trigger signal, which causes clock counter 608 to begin counting cycles of system clock signal Sysclk. After N cycles, comparator 610 asserts clock control signal ClkCtl. In response, clock manipulation module 112 manipulates system clock signal Sysclk for one or more clock cycles, and provides the resulting signal as function clock signal Fclk.

Figure 7:
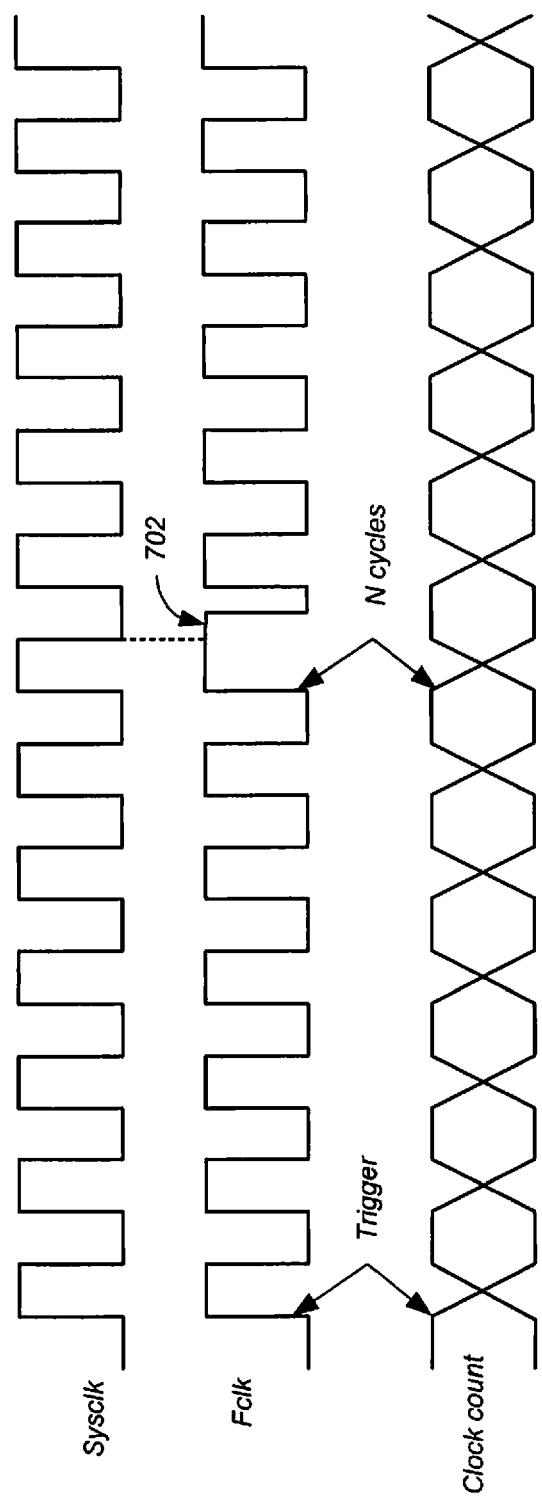
FIG. 7 is a timing diagram illustrating an operation of the clock control module of FIG. 6 according to one embodiment.

FIG. 7 is a timing diagram illustrating an operation of clock control module 114 of FIG. 6 according to one embodiment. Referring to FIG. 7, clock manipulation module 112 passes system clock signal Sysclk until N=7 cycles following assertion of the Trigger signal. At that point, clock manipulation module 112 manipulates system clock signal Sysclk, and provides the resulting signal as function clock signal Fclk. In this example, clock manipulation module 112 delays the falling edge of system clock signal Sysclk, as shown in FIG. 7 at 702.

Some embodiments include an auto-step feature. According to the auto-step feature, after function clock Fclk is stopped, and the test data is extracted from scan chain 124, auto-step module 602 increments the value of N in cycle register 604, resets function module 106 by asserting a Reset signal, and repeats the scan test. In this manner, several different clock cycles can be tested automatically. A final offset integer M can be specified as the final clock cycle to be tested, thereby bounding the range of clock cycles tested.

Figure 8:
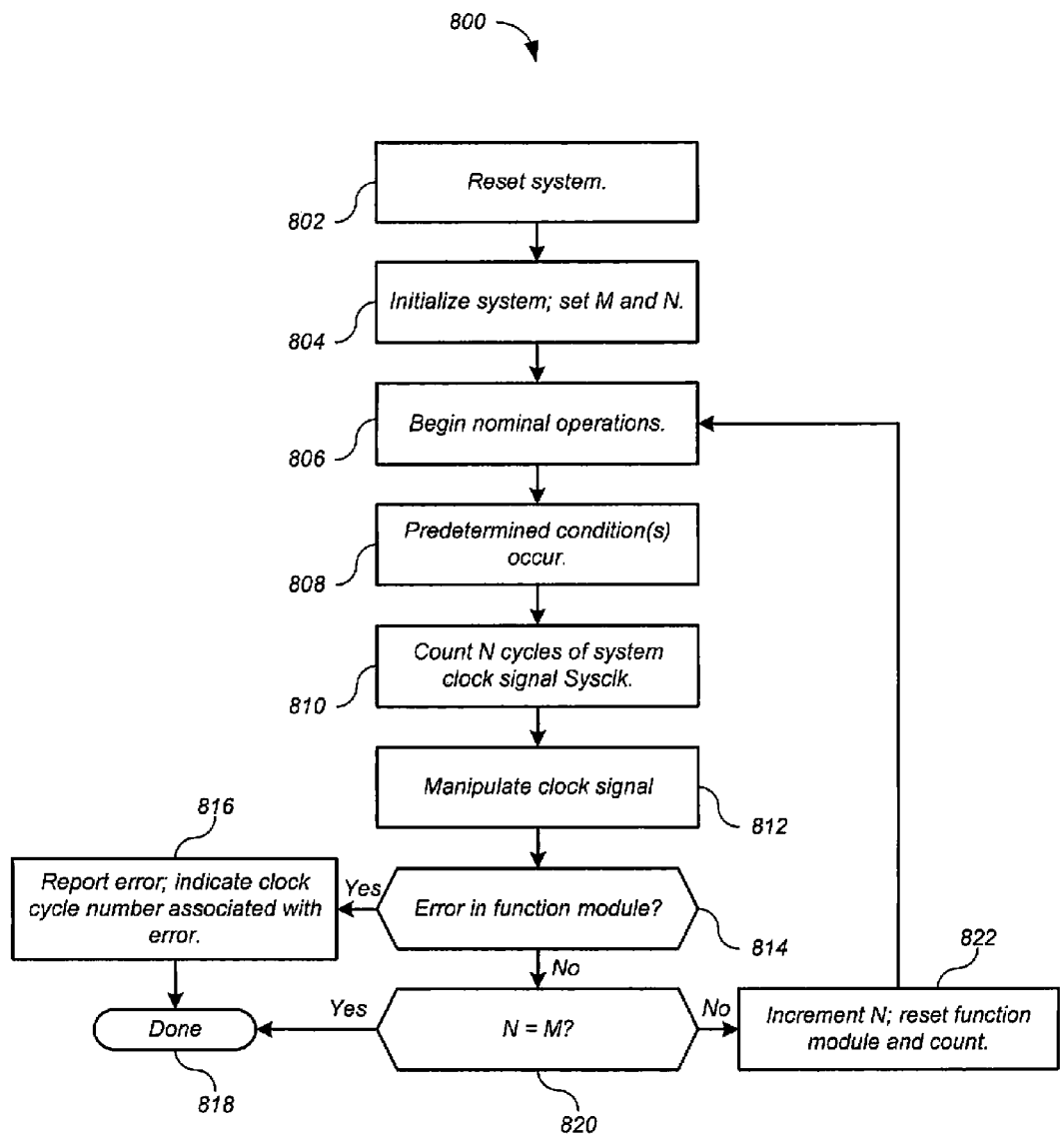
FIG. 8 shows an auto-step process for the integrated circuit test system of FIG. 1 according to one embodiment.

FIG. 8 shows an auto-step process 800 for integrated circuit test system 100 of FIG. 1 according to one embodiment. Although in the described embodiments the elements of process 800 are presented in one arrangement, other embodiments may feature other arrangements. For example, in various embodiments, some or all of the steps of process 800 can be executed in a different order, concurrently, and the like.

Referring to FIG. 8, at 802 integrated circuit test system 100 is reset. At 804 integrated circuit test system 100 is initialized. In particular, clock control module 114 is programmed to assert clock control signal ClkCtl upon the occurrence of one or more predetermined conditions, for example, when one or more monitored signals assume predetermined values. In addition, auto-step module 602 loads an initial value for offset integer N, and a value for final offset integer M, into cycle register 604. At 806, function module 106 begins nominal operations at full clock speed. Nominal operations continue until upon the occurrence of one or more predetermined conditions at 808. Then at 810, clock control module counts N cycles of system clock signal Sysclk before manipulating system clock Sysclk at 812. In particular, when the monitored signals assume predetermined values, trigger module 606 asserts the Trigger signal, which causes clock counter 608 to begin counting cycles of system clock signal Sysclk. When the count reaches N, comparator 610 asserts clock control signal ClkCtl. In response, clock manipulation module 112 manipulates one or more edges in one or more cycles of system clock signal Sysclk, and provides the resulting signal as function clock signal Fclk.

At 814 if an error is detected, then at 816 report module 128 reports the error to test data module 120, and indicates the clock cycle number N associated with the error. Then process 800 is done at 818. Clock cycle number N can then be used to debug function module 106, as described above.

However, if at 814 no error occurs, and at 820 the value of offset integer N has not reached its final value M, then at 822 auto-step module 602 increments the value of N in cycle register 604 and asserts the Reset signal, which resets function module 106 and the count held by clock counter 608. In some embodiments, the value of N is incremented by 1 each time. In other embodiments, other values can be used. The testing then continues with the resumption of nominal operations at 806.

However, when at 820 the value of offset integer N has reached its final value M (N=M), process 800 is done at 818. In this case, the testing of the specified range of clock cycles has been completed successfully.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. A circuit comprising:
   a clock module configured to generate a first clock signal;
   a control module configured to generate a control signal;
   a manipulation module configured to, based on the control signal, either (i) forward the first clock signal without modifying the first clock signal or (ii) modify a cycle of the first clock signal to simulate a second clock signal and forward the first clock signal with the modified cycle, wherein the second clock signal has a frequency higher than a frequency of the first clock signal; and
   a function module configured to (i) during a first mode and based on a non-modified cycle of the first clock signal, operate a plurality of devices in a predetermined configuration, (ii) cease operating in the first mode and change the predetermined configuration of the plurality of devices to form a scan chain, and (iii) during a second mode and based on the modified cycle of the first clock signal, operate the scan chain to test the plurality of devices.

2. The circuit of claim 1, wherein the function module is configured to, during the first mode, operate the plurality of devices in the predetermined configuration based on the non-modified cycle of the first clock signal and not based on the modified cycle of the first clock signal.

3. The circuit of claim 1, further comprising an error module configured to (i) detect an error in the function module, and (ii) indicate a number of the cycle of the first clock signal during which the error occurred,
   wherein the function module includes the plurality of devices.

4. The circuit of claim 3, wherein the manipulation module is configured to, while modifying the cycle of the first clock signal, delay a rising edge or a falling edge of a pulse of the cycle of the first clock signal.

5. The circuit of claim 4, wherein:
   the control module is configured to (i) monitor an input signal, (ii) detect a predetermined condition of the input signal, and (ii) generate the control signal based on the detection of the predetermined condition; and the number of the cycle of the first clock signal is a predetermined number of cycles after occurrence of the predetermined condition in the input signal.

6. The circuit of claim 1, further comprising an error module configured to (i) detect whether an error has occurred in the function module, and (ii) if an error has occurred, indicate a number of the cycle of the first clock signal during which the error occurred, wherein:
the control module is configured to (i) monitor an input signal, (ii) detect a predetermined condition of the input signal, and (ii) generate the control signal based on the detection of the predetermined condition;
the manipulation module modifies the cycle of the first clock signal such that the number of the cycle of the first clock signal is a predetermined number of cycles after occurrence of the predetermined condition in the input signal; and
the manipulation module is configured to, based on determining no error has occurred in the function module, adjust the predetermined number of cycles for subsequently modified cycles of the first clock signal.

7. The circuit of claim 1, further comprising:
a mode module configured to generate a mode signal; and
a multiplexer configured to connect the plurality of devices in
the predetermined configuration if the mode signal is in a first state, and
a second configuration to form the scan chain if the mode signal is in a second state.

8. The circuit of claim 1, further comprising a mode module configured to generate a mode signal, wherein the function module comprises:
a first device configured to store a first input signal based on the first clock signal;
a second device configured to, based on the first clock signal, store a second input signal;
a first circuit configured to receive an output of the first device;
a second circuit configured to receive an output of the second device;
a first multiplexer configured to receive an output of the first circuit;
a second multiplexer configured to, based on the mode signal, output either the output of the second device or an output of the second circuit;
a third device configured to
store an output of the first multiplexer, and
generate a first output signal based on (i) the first clock signal, and (ii) the output of the first multiplexer; and
a fourth device configured to
store an output of the second multiplexer, and
generate a second output signal based on (i) the first clock signal, and (ii) the output of the second multiplexer,
wherein the first multiplexer is configured to, based on the mode signal, provide as the output of the first multiplexer either the output of the first circuit or the second output signal.

9. The circuit of claim 8, further comprising a data module configured to generate a third input signal based on the first output signal, wherein the function module comprises:
a third multiplexer configured to, based on the mode signal, output either the third input signal or a first data signal to provide the first input signal; and
a fourth multiplexer configured to, based on the mode signal, output either the output of the first device or a second data signal to provide the second input signal.

10. The circuit of claim 1, wherein the manipulation module comprises:
a first gate configured to receive the first clock signal and a delayed version of the first clock signal;
a second gate configured to receive the first clock signal and delayed version of the first clock signal;
a second control module configured to generate a selection signal; and
a multiplexer configured to, based on the selection signal, output the first clock signal, an output of the first gate, an output of the second gate, or the delayed version of the first clock signal,
wherein the function module is configured to (i) during the first mode, operate the plurality of devices in the predetermined configuration based on the output of the multiplexer, and (ii) during the second mode, operate the scan chain based on the output of the multiplexer.

11. The circuit of claim 1, wherein the control module comprises:
a cycle register configured to store an offset integer;
a trigger module configured to (i) monitor an input signal, and (ii) detect a predetermined condition of the input signal;
a clock counter configured to count cycles of the first clock signal subsequent to occurrence of the predetermined condition;
a step module configured to (i) increment the offset integer, and (ii) reset the function module based on no occurrence of an error in the function module; and
a comparator configured to compare the offset integer to a number of cycles of the first clock signal counted by the clock counter to generate the control signal.

12. The circuit of claim 1, wherein:
during the first mode, the plurality of devices are in the predetermined configuration to provide a first scan chain for a first test of the plurality of devices, wherein the scan chain formed when the predetermined configuration of the plurality of devices is changed is a second scan chain; and
during the second mode, the plurality of devices are in a second configuration to provide the second scan chain for a second test of the plurality of devices.

13. A method comprising:
generating a first clock signal;
generating a control signal;
based on the control signal, either (i) forwarding the first clock signal without modifying the first clock signal or (ii) modifying a cycle of the first clock signal to simulate a second clock signal and forwarding the first clock signal with the modified cycle, wherein the second clock signal has a frequency higher than a frequency of the first clock signal;
during a first mode and based on a non-modified cycle of the first clock signal, operating a plurality of devices in a predetermined configuration;
ceasing operating in the first mode and changing the predetermined configuration of the plurality of devices to form a scan chain; and
during a second mode and based on the modified cycle of the first clock signal, operating the scan chain to test the plurality of devices.

14. The method of claim 13, wherein, during the first mode, the plurality of devices are operated in the predetermined configuration based on the non-modified cycle of the first clock signal and not based on the modified cycle of the first clock signal.

15. The method of claim 13, further comprising:
- detecting an error in the plurality of devices; and
- indicating a number of the cycle of the first clock signal during which the error occurred.

16. The method of claim 15, wherein the modifying of the cycle of the first clock signal includes delaying a rising edge or a falling edge of a pulse of the cycle of the first clock signal.

17. The method of claim 16, further comprising:
- monitor an input signal;
- detecting a predetermined condition of the input signal; and
- generating the control signal based on the detection of the predetermined condition,
- wherein the number of the cycle of the first clock signal is a predetermined number of cycles after occurrence of the predetermined condition in the input signal.

18. The method of claim 13, further comprising:
- detecting whether an error has occurred;
- if an error has occurred, indicating a number of the cycle of the first clock signal during which the error occurred;
- monitoring an input signal;
- detecting a predetermined condition of the input signal;
- generating the control signal based on the detection of the predetermined condition;
- modifying the cycle of the first clock signal such that the number of the cycle of the first clock signal is a predetermined number of cycles after occurrence of the predetermined condition in the input signal; and
- based on determining no error has occurred, adjusting the predetermined number of cycles for subsequently modified cycles of the first clock signal.

19. The method of claim 13, further comprising:
- generating a mode signal; and
- via a multiplexer, connecting the plurality of devices in the predetermined configuration if the mode signal is in a first state, and a second configuration to form the scan chain if the mode signal is in a second state.

20. The method of claim 13, further comprising:
- receiving the first clock signal and a delayed version of the first clock signal at a first gate;
- receiving the first clock signal and delayed version of the first clock signal at a second gate;
- generating a selection signal; and
- based on the selection signal, outputting from a multiplexer the first clock signal, an output of the first gate, an output of the second gate, or the delayed version of the first clock signal,
- wherein, during the first mode, the plurality of devices are operated in the predetermined configuration based on the output of the multiplexer, and
- wherein, during the second mode, the scan chain is operated based on the output of the multiplexer.

21. The method of claim 13, further comprising:
- storing an offset integer;
- monitoring an input signal;
- detecting a predetermined condition of the input signal;
- counting, via a clock counter, cycles of the first clock signal subsequent to occurrence of the predetermined condition;
- incrementing the offset integer;
- determining whether an error has occurred in the plurality of devices;
- resetting a function module based on no occurrence of an error in the plurality of devices, wherein the function module comprises the plurality of devices; and
- comparing the offset integer to a number of cycles of the first clock signal counted by the clock counter to generate the control signal.

* * * * *